United States Patent [19]

Ueno et al.

[11] Patent Number: 4,640,747

[45] Date of Patent: Feb. 3, 1987

[54] PROCESS FOR SURFACE TREATMENT OF COPPER PRODUCT

[75] Inventors: Kuniki Ueno; Naotomi Takahashi, both of Saitama, Japan

[73] Assignee: Mitsui Mining and Smelting Co., Ltd., Japan

[21] Appl. No.: 790,389

[22] Filed: Oct. 23, 1985

[30] Foreign Application Priority Data

Nov. 6, 1984 [JP] Japan ................. 59-233572

[51] Int. Cl.$^4$ ............................. C25D 5/50
[52] U.S. Cl. ................... 204/37.1; 29/840; 204/20; 204/35.1; 204/43.1; 204/40; 204/44.2
[58] Field of Search ............. 204/37.1, 35.1, 44.2, 204/43.1, 40, 44, 20

[56] References Cited

U.S. PATENT DOCUMENTS

| | | | |
|---|---|---|---|
| 3,377,259 | 4/1968 | Phillips | 204/20 |
| 3,585,010 | 6/1971 | Luce et al. | 204/44 |
| 3,857,681 | 12/1974 | Yates et al. | 204/40 |
| 4,104,134 | 8/1978 | Roberts | 204/37.1 |
| 4,189,331 | 2/1980 | Roy | 204/37.1 |
| 4,268,364 | 5/1981 | Hall | 204/44.2 |
| 4,376,154 | 3/1983 | Nakatsugawa | 204/44.2 |
| 4,456,508 | 6/1984 | Torday et al. | 204/44.2 |
| 4,469,567 | 9/1984 | Torday et al. | 204/27 |
| 4,572,768 | 2/1986 | Wolski et al. | 204/44.2 |

*Primary Examiner*—Arthur P. Demers
*Attorney, Agent, or Firm*—Jeffers, Irish & Hoffman

[57] ABSTRACT

A process for surface-treating copper products, for example, a copper foil to be used for a copper-clad laminate, the resulting surface-treated copper product having a superior bond strength to a base material, resistant to etching solution, acids, etc., is provided, which process comprises electrically depositing a binary alloy consisting of 95 to 20% by weight of zinc and 5 to 80% by weight of nickel, on the surface of a copper product to form a coating layer, followed by laminating the resulting copper product onto a base material under heating and pressure, said binary alloy being converted during the lamination into a ternary alloy of zinc, nickel and copper constituting a boundary layer having a superior bond strength between the copper product and the base material.

7 Claims, No Drawings

PROCESS FOR SURFACE TREATMENT OF COPPER PRODUCT

BACKGROUND OF THE INVENTION

1. Field of the Invention

This invention relates to a process for surface-treating copper products, for example, a copper foil used for printed circuits or the like. More particularly it relates to a process for surface-treating a copper foil by making ternary alloy of zinc-nickel-copper on the surface of the foil, which prevents reduction of peel strength between copper foil and base material caused by corrosion with an etching solution or an aqueous solution of hydrochloric acid, etc.

2. Related Art Statement

Copper-clad laminates have usually been used for printed circuits and prepared by bonding a copper foil a base material. The surface of the copper foil with which the base material is bonded has been subjected to various chemical or electrochemical treatments. Namely, in order to enhance the bond strength of the foil onto the base material, a granular copper layer has been electrically deposited on the surface of the copper foil to form a roughened surface, followed by coating the roughened surface of the electrically deposited copper with a metal such as zinc, tin, nickel or brass (U.S. Pat. No. 3,585,010, U.S. Pat. No. 3,377,259, U.S. Pat. No. 2,802,897).

This zinc layer prevents the granular copper from migration, and also prevents spotting or staining after etching the copper foil. The layer has a thickness to such an extent at the high bond strength of the granular copper layer is not reduced.

During lamination said copper foil is usually heat pressed. By application of heat and pressure, zinc layer is converted into brass by mutual diffusion between the zinc layer and copper substrate and exhibits yellow color. Thus after laminating the copper foil with base material, the resulting boundary forms a brass layer.

When a printed circuit is produced using said copper-clad laminate, the following processes are employed: The copper-clad laminate is punched or drilled. The inside of the holes are activated, and copper is uniformly deposited thereon by means of non-electrolytic plating, followed by electrolytic plating to increase the copper thickness. Then photoresist is applied onto said copper foil and a pattern etching is carried out to obtain a desired printed circuit.

During the activation treatment of the inside of holes and during the pattern etching, the boundary layer i.e. the brass layer is exposed to a solution containing hydrochloric acid. Further, after the pattern etching, various plating processes may often be carried out. In such case, the brass layer is exposed several times to various plating solutions and acidic solutions. Since the brass layer is hardly resistant to hydrochloric acid the brass layer is corroded due to dezincification so that peel strength between the copper foil and the base material is likely to be reduced.

SUMMARY OF THE INVENTION

The object of the present invention is to provide a process for surface-treating copper products, for example, a copper foil so as to give a hydrochloric acid-resistant boundary layer between the copper foil and a base material, in the preparation of a copper-foil laminate.

The present inventors have made extensive research on such a process and as a result have found that when a binary alloy of zinc and nickel is used as a copper layer-coating metal on the surface of the copper foil to convert into a ternary alloy of zinc, nickel and copper at the time of laminating the copper foil on the base material, the resistance to hydrochloric acid is improved, and also have found a zinc-nickel composition which is readily convertible into a ternary alloy of zinc-nickel-copper by a conventional operation of preparing copper-clad laminates.

The present invention resides in a process for surface-treating a copper product, which process comprises electrically depositing a binary alloy consisting of 95 to 20% by weight of zinc and 5 to 80% by weight of nickel, on the surface of a copper product to form a coating layer, followed by laminating or heat-pressing copper product thus obtained onto a base material so as to convert said binary alloy into a ternary alloy of zinc, nickel and copper.

DETAILED DESCRIPTION OF PREFERRED EMBODIMENTS

As discribed above, in the preparation of copper-clad laminates, a roughened surface of electrically deposited copper is formed on the surface of copper foil to be bonded onto a base material to enhance peel strength between the copper foil and the base material, and a binary alloy is coated on the roughened surface of electrically deposited copper. In order that the resulting coating layer does not reduce the peel strength of said roughened surface, it is preferred that the coating layer is as thin as to keep the roughness, but on the other hand, the coating layer is necessary to have a thickness enough to prevent granular copper from migration. The thickness of such a coating layer has been usually about 0.08 $\mu$m, whereas in the present invention, 0.002 $\mu$m may be sufficient since the ternary alloy of zinc, nickel and copper of the present invention is superior in the capability of preventing the migration and the resistance to acids. The coating layer is faced to the base material and bonded thereto by heat-pressing. At that time, a mutual diffusion occurs between the coating layer and copper substrate, and conversion into a ternary alloy of zinc-nickel-copper proceeds to give a boundary layer consisting of the ternary alloy having a superior resistance to hydrochloric acid. The operation of laminating the copper foil is carried out usually at a temperature of about 170° C. and a pressure of about 20 kg/cm for one hour. In this case, if the nickel content in the coating layer exceeds 80% by weight, the conversion into the ternary alloy does not sufficiently proceed, while if the content is lower than 5% by weight, the resistance to hydrochloric acid of the ternary alloy lowers; hence the nickel content in the coating layer is preferred to be 5 to 80% by weight. The nickel content is more preferably 10 to 50% by weight. In this case, in the above operation of lamination, the conversion into the ternary alloy sufficiently proceeds as far as the surface of the coating layer i.e. the boundary layer to the base material, and the boundary layer exhibits a red-yellow color. Further the thickness of the coating layer is preferably 0.001 to 0.15 $\mu$m, more preferably 0.001 to 0.01 $\mu$m. If the thickness exceeds 0.15 $\mu$m, the conversion into the ternary alloy does not sufficiently proceed in a conventional operation of lamination, while if it is less than 0.001 μm, the copper content in the ternary alloy becomes very high during lamination unable to fully function as the ternary alloy. In the case of a thickness of 0.001 to 0.1 μm, the bond strength and the resistance to acids are particularly superior.

When the surface treatment as described above, of the present invention is carried out, the electrolyte used therein has the following fundamental composition:

Potassium Pyrophosphate: 100 g/l
Zinc Pyrophosphate: 20 g/l
Nickel Pyrophosphate: 7.5 g/l This composition corresponds to the case where the nickel content in the binary alloy is 30% by weight. When the nickel concentration of nickel pyrophosphate is varied, it is possible to vary the nickel content in the binary alloy to be electrically deposited. For example, when the concentration of nickel pyrophosphate is 1.2, 2.4, 14 or 19 g/l, the nickel content in the binary alloy to be electrically deposited is 5, 10, 60 or 80% by weight. For example, keeping the electrolyte at a pH of 9.5 and at a bath temperature of 25° C., electro-deposition is carried out with a current density of 0.2 A/dm² for about 10 seconds.

The present invention will be described in more detail by way of Example.

The process for surface treatment of the present invention can be carried out generally in the acid-resistant treatment of the surface of copper products besides a copper foil used for preparation of copper-clad laminate. In these cases, copper products do not always bond to base materials.

EXAMPLE

A roughened surface of copper electrically deposited on a copper foil was coated by a coating layer of 0.005 μm thick consisting of a binary alloy of zinc and nickel having various nickel contents indicated in Table 1. The resulting layer was bonded onto a glass fiber-reinforced epoxy sheet at a temperature of 160° C. and a pressure of 20 kg/cm² for one hour to form a copper-clad laminate. In the case of a nickel content of 80%, the color of the resulting boundary surface remained white-gray, while in the case of 5 to 70%, the color turned into a red-yellow color.

For comparison, a conventional copper foil having zinc electrically deposited thereon using a zinc-plating bath and that having zinc-copper alloy electrically deposited thereon using a conventional cyanide bath were prepared and copper-clad lamintes were similarly formed from these copper foils. In addition, the zinc-coating layer and the zinc-copper alloy-coating layer bath had a thickness of about 0.005 μm.

Next, copper-clad laminates wherein copper foils of the present invention coated by the above binary alloys were used and the copper-clad laminate wherein a conventional copper foil was used, were compared by their immersion tests in an aqueous solution of hydrochloric acid to determine the percentage deterioration of the bond strength.

In addition, a rectangular pattern of 0.8 mm wide and 50 mm long was formed on the respective copper-clad laminates according to a conventional etching process to obtain testing samples.

The percentage deterioration was calculated from the following equation:

$$C = (A-B)/A \times 100$$

wherein A: bond strength (kg/cm) after laminating of copper foil, B: bond strength (kg/cm) after immersion in a 20% aqueous solution of hydrochloric acid at 25° C. for 30 minutes, each being measured by 90° peeling test, and C: percentage deterioration (%) expressing the reduction extent from A into B. The results are shown in Table 1. As apparent from this Table, the percentage deterioration in the case where the copper foil of the present invention was used is extremely low. This indicates that the resistance to hydrochloric acid, of the boundary layer between the copper foil and the base material is very high.

TABLE 1

|  | Ni-content (%) | A (kg/cm) | B (kg/cm) | C (%) |
|---|---|---|---|---|
| Present Invention | 1 | 2.20 | 1.54 | 30 |
|  | 5 | 2.20 | 1.98 | 10 |
|  | 10 | 2.25 | 2.18 | 3 |
|  | 30 | 2.25 | 2.22 | 1 |
|  | 50 | 2.25 | 2.20 | 2 |
|  | 80 | 2.05 | 2.03 | 1 |
| Zn layer |  | 2.05 | 1.56 | 24 |
| Zn—Cu layer |  | 2.05 | 1.56 | 24 |

Note:
Zn layer" and "Zn—Cu layer" refer to conventional products.

As apparent from the foregoing, the boundary layer of the copper foil subjected to the surface treatment of the present invention has a superior resistance to acids; hence in the process of preparing printed circuits, there is almost no fear that the boundary layer is corroded by an etching solution, an aqueous solution of hydrochloric acid, etc. to deteriorate its bond strength. Further, neither spotting nor staining occurs. Still further, it has become possible to attain the above object by means of a coating layer having a very small thickness which has never been known.

What is claimed is:

1. A process for surface-treating a copper product, which process comprises electrically depositing a binary alloy consisting of 95 to 20% by weight of zinc and 5 to 80% by weight of nickel, on the surface of a copper product to form a coating layer, followed by laminating or heat-pressing copper product thus obtained onto a base material so as to convert said binary alloy into a ternary alloy of zinc, nickel and copper.

2. A process for surface-treating a copper product according to claim 1 wherein said surface of a copper product is a roughened surface formed by a granular copper layer electrically deposited on the copper product.

3. A process for surface-treating a copper product according to claim 2 wherein said copper product is a copper foil to be used for a copper-clad laminate.

4. A process for surface-treating a copper product according to claim 3 wherein said coating layer has a thickness of 0.001 to 0.15 μm.

5. A process for surface-treating a copper product according to claim 3 wherein said coating layer has a thickness of 0.001 to 0.01 μm.

6. A process for surface-treating a copper product according to claim 3 wherein said binary alloy consists of 90 to 50% by weight of zinc and 10 to 50% by weight of nickel.

7. A process for surface-treating a copper foil according to claim 1 wherein said electro-deposition of a binary alloy is carried out using an electrolyte containing as fundamental components, potassium pyrophosphate, zinc pyrophosphate and nickel pyrophosphate.

* * * * *